United States Patent

Ishigami et al.

Patent Number: 5,679,983
Date of Patent: Oct. 21, 1997

[54] HIGHLY PURIFIED METAL MATERIAL AND SPUTTERING TARGET USING THE SAME

[75] Inventors: Takashi Ishigami, Yokohama; Minoru Obata, Inagi; Mituo Kawai, Yokohama; Michio Satou, Yokohama; Takashi Yamanobe, Yokohama; Toshihiro Maki, Yokohama; Noriaki Yagi, Yokohama; Shigeru Ando, Hiratsuka, all of Japan

[73] Assignee: Kabushiki Kaisha Toshiba, Kawasaki, Japan

[21] Appl. No.: 454,583

[22] Filed: May 31, 1995

Related U.S. Application Data

[62] Division of Ser. No. 351,542, Dec. 7, 1994, Pat. No. 5,458,697, which is a continuation of Ser. No. 986,704, Dec. 8, 1992, abandoned, which is a division of Ser. No. 655,950, Feb. 15, 1991, Pat. No. 5,196,916.

[30] Foreign Application Priority Data

Feb. 15, 1990 [JP] Japan .................... 2-36908

[51] Int. Cl.$^6$ .................... H01L 23/48; H01L 23/52; H01L 29/40
[52] U.S. Cl. .................... 257/765; 257/771
[58] Field of Search .................... 257/761, 763, 257/764, 765, 771

[56] References Cited

U.S. PATENT DOCUMENTS

| | | | |
|---|---|---|---|
| 4,788,160 | 11/1988 | Havemann et al. | 437/192 |
| 4,793,854 | 12/1988 | Shimotori et al. | 75/10.1 |
| 4,896,204 | 1/1990 | Hirata et al. | 257/765 |
| 4,897,287 | 1/1990 | Berger et al. | 437/192 |
| 4,920,073 | 4/1990 | Wei et al. | 437/192 |
| 5,019,891 | 5/1991 | Onuki et al. | 257/771 |
| 5,049,975 | 9/1991 | Ajika et al. | 437/192 |
| 5,070,038 | 12/1991 | Jin | 437/192 |
| 5,087,578 | 2/1992 | Endo et al. | 437/192 |
| 5,143,866 | 9/1992 | Matsutani | 437/192 |
| 5,175,126 | 12/1992 | Ho et al. | 437/190 |
| 5,196,916 | 3/1993 | Ishigami et al. | 257/763 |
| 5,345,108 | 9/1994 | Kikawa et al. | 257/765 |
| 5,349,205 | 9/1994 | Kobayashi et al. | 257/765 |

OTHER PUBLICATIONS

Lee, Seung-Yee, "Ti. Zr Smelting," *Non-ferrous Metal Smelting Engineering*, Korea, Jan. 25, 1987, pp. 406–408.

Yang, Hun-Young, "Special Melt Refining Method," *Iron & Steel Smelting Engineering*, Korea, Jan. 25, 1987, pp. 424–425.

*Primary Examiner*—Sara W. Crane
*Assistant Examiner*—S. V. Clark
*Attorney, Agent, or Firm*—Foley & Lardner

[57] ABSTRACT

This is a highly purified metal comprising one metal selected from the group consisted of titanium, zirconium and hafnium. The highly purified metal has an Al content of not more than 10 ppm. It also has an oxygen content of more than 250 ppm, each of Fe, Ni and Cr contents not more than 10 ppm and each of Na and K contents not more than 0.1 ppm. The highly purified metal is obtained by either purifying crude metal by the iodide process or surface treating crude metal to remove a contaminated layer existing on the surface thereof and then melting The surface treated material with electron bean in a high vacuum.

3 Claims, 8 Drawing Sheets

HIGHLY PURIFIED METAL MATERIAL AND SPUTTERING TARGET USING THE SAME this application is a division, of application Ser. No. 08/351,542, filed Dec. 7, 1994, now U.S. Pat. No. 5,458,697, which is a continuation of application Ser. No. 07/986,704, filed Dec. 8, 1992, now abandoned, which is a division of application Ser. No. 07/655,950, filed Feb. 15, 1991, now U.S. Pat. No. 5,196,916.

BACKGROUND OF THE INVENTION

The present invention relates to a highly purified metal suitable as a target material for the formation of electrode, contact part and barrier layer of a semi-conductor device, a method for the manufacture of the same and a sputtering target using the same.

As the material to form wiring layer and electrode of a semi-conductor device like LSI, a silicide of a metal having a high melting point such as Mo, W, Ta, Ti, Zr and Hf have been used. Further, because there is a tendency of furthering high integration of semi-conductor devices and calling for more minute wiring structures, the possibility of various problems has been watched with misgivings.

In the case of, for example an Al wiring, minute wiring and higher current density required therefor give rise to electromigration that Al atoms are carried away in the direction of the electron movement or an increase of working heat. These lead to a problem that Al wirings are susceptible to burn-out. Further, an increase in wiring resistance due to minute wiring materials causes delay of signals. Thus, particularly Ti silicides have attracted attention as the wiring and electrode material because they not only have a high melting point but also a low resistance.

For example, when a Ti silicide is intended for use as the material for electrode, a Ti film is formed over a polysilicon film by the sputtering process. Then the Ti film is heat-treated to make a silicide out of Ti. What is called a polycide structure prepared in this way has been put to use. On the other hand, an attempt has been made to make contact parts of a Ti silicide as the built-in protection in order to reduce contact resistance. Further, a contact part is inlaid with, for example a Ti film serving as a diffusion barrier layer in order to prevent Si from precipitating into Al wirings. In this sense, a laminated structure of Al/TiN/TiSi$_2$ has been used. A TiN film is formed of a reactive sputtering material and the like.

As stated above, a TiN film or a TiSi$_2$ film is made by the sputtering process. Therefore, the sputtering target required for the process must be made of a Ti material. It is important that the Ti target for that purpose has a high purity. When a Ti target contains an impurity of oxygen, the film formed therefrom has high electric resistance, causing a trouble of delay of signals or burn-out of wirings. Further, a heavy metal such as Fe, Ni and Cr collects on the interface of a laminated film and form a deep level, causing leakage at the joint thereof. An alkali metal such as Na and K readily sets Si free, deteriorating the properties of the device.

Meanwhile, a Ti material for the above mentioned Ti target generally is manufactured according to the so-called Kroll method or Hunter method to thermally reduce a Ti compound such as TiCl$_4$ with an active metal such as Na and Mg or the fused salt electrolysis process using a fused salt consisting of alkaline metal compound. In recent years when metal purification technology has advanced and manufacturing processes have been well managed, incorporation of impurities such as heavy metal has been brought down to a very low level.

However, even in the case where a TiSi$_2$ film for use in contact parts is formed of a Ti target having a very low content of such impurities as heavy metal, there is a problem that leakage at the junction cannot be sufficiently prevented because of very minute wiring. This makes an important cause of the loss of fidelity of semi-conductor devices. Further, in a barrier layer, an increase of current density which is caused by reduction of wiring width, leading to malfunction of the layer and leakage at the junction. It is expected that these problems will be exacerbated in the future as integration of semi-conductor devices advances. These problems occur not only when electrodes and barrier layers are made of Ti compounds but also when they are made of Zr and Hf compounds.

SUMMARY OF THE INVENTION

Therefore, an object of the present invention is to provide a highly purified metal for the production of an electrode and a contact part capable of preventing malfunctions thereof in a highly integrated semi-conductor device and for the formation of a barrier layer capable of sufficiently preventing an increase of leakage at the junction.

Another object of the present invention is to provide a method for the manufacture of highly purified metal making it possible to manufacture well reproducible a highly purified metal having the above mentioned properties.

Furthermore, still another object of the present invention is to provided a sputtering target capable of forming well reproducibly an electrode, a contact part, a barrier layer and the like respectively having high fidelity.

The present inventors have gone ahead with the researches of impurities contained in target materials of Ti, Zr, Hf and the like, resulting in the findings that the above mentioned problems are accounted for by Al which has not been given much thought among other impurities of conventional targets. In other words, it has been brought to light that the Al content need be lowered as much as possible on top of that of heavy and alkali metals, when an electrode, a contact part, a barrier layer and the like of a semi-conductor device are made of a target of Ti and the like according to the sputtering method. However, the Al content cannot be sufficiently reduced according to conventional manufacturing methods, remaining at a level such as 2000 ppm if it is a high side and finding no place as a forming material for highly integrated semi-conductor devices.

The highly purified metal of the present invention has been achieved on the basis of the above mentioned finding and is characterized by having a Al content of not more than 10 ppm. The sputtering target of the present invention is characterized in that it is made by molding the above mentioned highly purified metal into a desired form. The highly purified metal is made by comprising one element selected from the group consisted of Ti, Zr and Hf.

The highly purified metal is useful as a wiring material for use in LSI, VLSI, ULSI and the like. Namely, a wiring network of the present invention to be formed on a substrate in a semi-conductor device is characterized by containing 10 ppm or less of Al and, specifically speaking, comprising a silicide, a nitride and the like of metals mentioned above. The wiring network like this can be obtained, for example according to the undermentioned production method. This is a production method comprising a step of forming a thin film from the sputtering target on a substrate in a semi-conductor device and a step of subjecting the thin film to etching treatment to eliminate portions other than the desired wiring network. The wiring network comprises an electrode, a contact part and a barrier layer of a semi-conductor device.

The metal having a least possible Al content of the present invention has been brought to completion by the finding that the Al content can be efficiently reduced according to the iodide process and that Al contained in crude Ti particles and the like by the fused salt electrolysis process is converged and stays on the particle surface region and can be efficiently removed by the application of surface treatment technology.

Namely, the first method for the manufacture of highly purified metal of the present invention comprises the steps of purifying crude metals according to the iodide process and a step of melting the so purified metals with an electron beam in a high vacuum. Further, the second method for the manufacture comprises the steps of surface-treating crude metals produced under the fused salt electrolysis process and removing a contaminated layer from their surface and a step of melting the surface treated-crude metals with an electron beam in a high vacuum.

The present invention provides an easy method for obtaining well reproducibly such a metal as Ti material, Zr material and Hf material respectively highly purified with a least possible Al content. A metal film and a metal compound film respectively having a low Al content can be well reproducibly formed by using said metal as a target material of the sputtering method, serving for an electrode, a contact part, a barrier layer and the like of a highly integrated semi-conductor device and contributing much to the promotion of semi-conductor device fidelity.

DESCRIPTION OF PREFERRED EMBODIMENT

The highly purified metal and the sputtering target of the present invention will now be described in detail with reference to embodiments.

Basically, the highly purified metal, that is the highly purified Ti material, the highly purified Zr material and the highly purified Hf material should have an Al content of not more than 10 ppm but the content of other impurities is at a low level as well. For example, the oxygen content is not more than 250 ppm, each of the Fe, Ni and Cr contents is not more than 100 ppm and each of the Na and K contents is not more than 0.1 ppm. Further, the U and Th contents preferably are not more than 0.001 ppm.

Here follows the reason why the Al content is limited to the above mentioned range: there is a sudden, high incidence of unacceptable quality of semi-conductor devices on account of leakage current when their electrodes, contact parts and barrier layers are made from Ti, Zr or Hf compounds using targets with the Al content exceeding 10 ppm.

The highly purified metal of the present invention is obtained by the application of either first or second manufacturing method as above mentioned.

Figure 1:
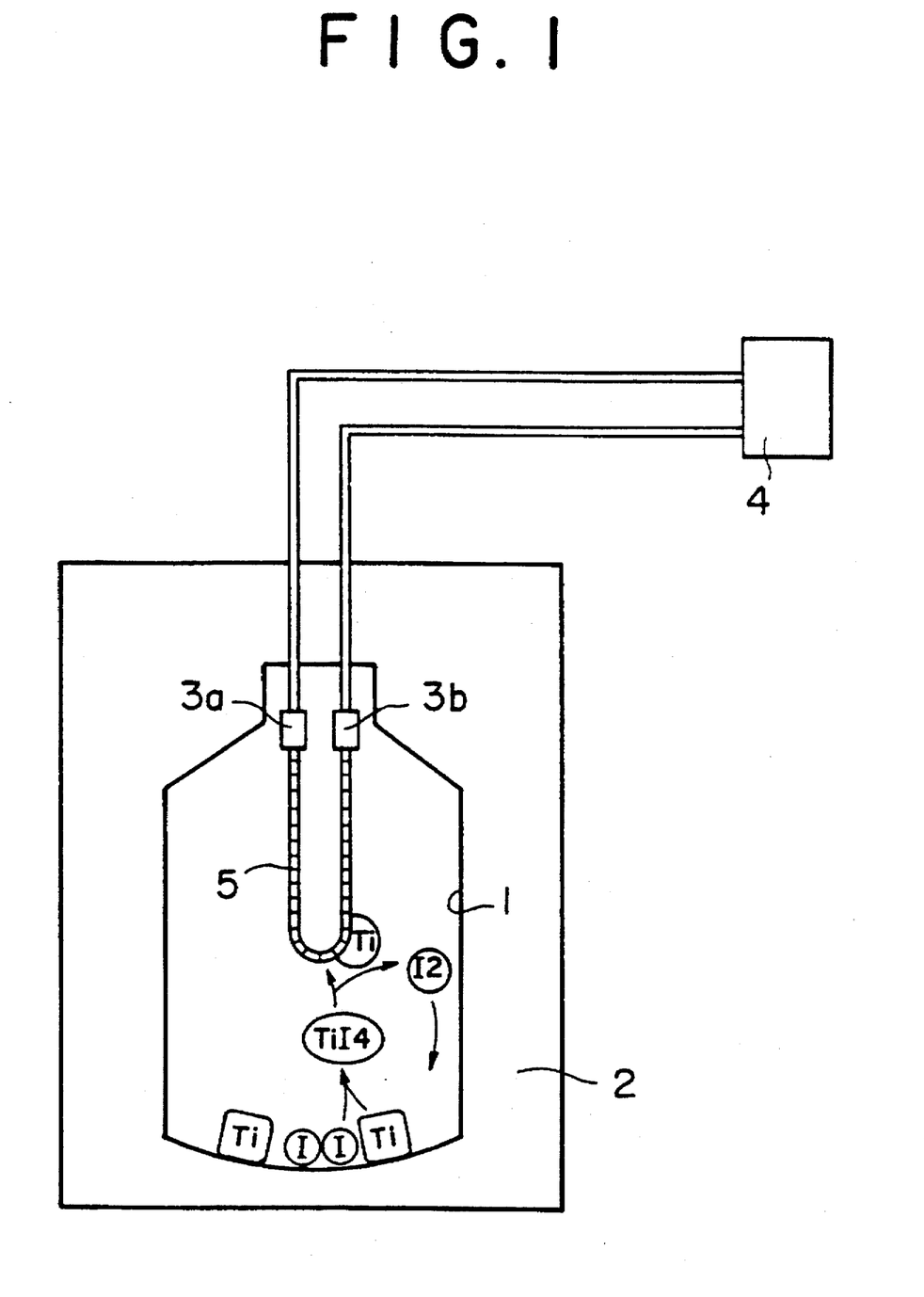
FIG. 1 shows an example of the purifying apparatus of the iodide process for use in the present invention.

To begin with, the first manufacturing method will be described in detail. The first manufacturing method is to purify crude metals at first according to the iodide process. Here, the iodide process will be described taking Ti as an example and referring to FIG. 1. FIG. 1 shows an example of a purification apparatus to purify Ti materials by means of the iodide process. Inside an electric furnace 2 there is a reaction container 1 receiving a crude Ti material and an iodine and within the reaction container 1 a filament 5 is set, connected with an electric source 4 via connecting plugs, 3a and 3b.

The iodide process method is a system of chemical delivery, capable of purifying Ti by using the reactions represented by formulae (1) and (2):

(1)

(100° C.–250° C. or 450° C.–600° C.)

(2)

(1100° C.–1500° C.)

The crude Ti material and the iodine are placed in the reaction container 1 and the filament 5 is electrically charged and heated to a temperature of 1100° C.–1500° C. to keep the inside of the reaction container 1 at 100° C.–250° C. or 450° C.–600° C. Then, the crude Ti material and the iodine are reacted each other according to the formula (1) to form $TiI_4$. Since the $TiI_4$ is a volatile substance, it is decomposed into a Ti and an iodine again according to the formula (2), allowing the Ti alone to precipitate on the filament 5. The almost elements having less reactive than Ti among impurities of the material remains in the rest of the material. If the impurity easily reacts with the iodine to form iodides, the element having low steam pressure is not incorporated into the filament in the above temperature of the reaction container. If the iodide has suffient stream pressure, incorporation into the filament is prevented by controlling the pressure within the reaction container and dissociation temperature.

As mentioned above, the iodide decomposition method takes advantage that the content of the specific impurity is electively reduced by controlling the temperature of the reaction container, the pressure within the container, the temperature of the filament and the like. Since Al is sufficiently less reactive with iodine than Ti in the range of the temperature within the reaction container shown in the above formula (I), Al can be effectively removed from Ti. Thus, during the process of production and dissociation reaction, Ti is purified, thereby to provide a Ti material with a least possible Al content. In this case, it is important to select as a material one having a low Al content, and select as a material of reaction container one having low Al content. The same is true of Zr and Hf.

The above mentioned iodide process can be operated by using as a starting material crude Ti materials which are obtained by various manufacturing methods such as Kroll process, Hunter process, fused salt electrolysis process and the like, but it is preferable to use therefor a Ti material produced by the fused salt electrolysis process. The reason for this likes in the fact that the purity of a Ti purified by the iodide process depends upon the purity of a starting material to some extent and by using the fused salt electrolysis process capable of producing a Ti material having a higher purity, still higher purification can be achieved.

Under the first manufacturing process of the present invention, the purification of crude metals by the above mentioned iodide process is followed by melting the so purified materials with an electron beam (hereinafter referred to as "EB melting") in a high vacuum of not more than $5\times10^{-5}$ mbar in order to finally remove Al, Na and K and to obtain a highly purified metal. The EB melting is a method for the separation of impurities using a difference of vapor pressure and highly efficient in removing particularly Al, Na and K each having a high vapor pressure.

Various metals are subjected to the EB melting, keeping a vacuum preferably not more than $5\times10^{-5}$ mbar, more preferably not more than $2\times10^{-5}$ mbar in the EB melting furnace, while preventing the entrance of a diffusion pump oil into said furnace with the use of a freon baffle. The operating conditions of EB melting are not particularly limited, but it is required that a melting speed should be determined taking into consideration the efficiency of purifying Na and K and the contamination due to the oxygen absorption. For example, a melting speed of 1.75 kg/hr–2.3 kg/hr is preferable. Further, a filament with a precipitated metal can be used as an electrode for the EB melting as it is.

As stated above, metals of Ti, Zr and Hf purified by the iodide process are subjected to the further purification according to the EB melting. Since said melting is implemented in a vacuum assuring less contamination due to oxygen and nitrogen, metals of high purity can be obtained.

Next, the second manufacturing process for highly purified metal of the present invention will be described. Under this second manufacturing process, crude metal particles are prepared at first according to the fused salt electrolysis process. For example, sponge Ti is used as a starting material therefore. Further, an electrolyte comprising KCl-NaCl and the like is preferable. The electrolytic temperature is preferably 730° C.–755° C. and the voltage 6.0V–8.0V. Meanwhile, since crude metals such as crude Ti particle contain impurities of metal elements including Al and oxygen which are converged in the neighborhood of the particle surface, the contaminated layer on the surface should be selectively removed.

This contaminated surface layer is removed by, for example (1) a method for surface treating said layer with an acid or an alkali and (2) a method for volatilizing and removing said layer with such halogen as iodine, fluorine, chlorine and bromine.

The above mentioned method (1) is preferably implemented in an atmosphere of such inactive gas such as argon gas to prevent the surface layer from recontamination particularly due to oxygen, conducting washing with purified water and drying afterwards. The treatment solution to be used therefor is an acidic solution such as hydrofluoric acid, nitric acid, sulfuric acid and their mixture or an alkaline solution such as a sodium hydroxide solution. Further, heavy metals can easily be eliminated by the fused salt electrolysis process and it is possible to attempt to remove selectively Al alone as it is existing in the neighborhood of the surface. The use of sulfuric acid or sodium hydroxide solution is efficient in this case.

The above mentioned method (2) is carried out as follows: a crude metal material obtained by the fused salt electrolysis process is placed in the purification apparatus using the iodide process as shown in FIG. 1, gaseous halogen is introduced thereto, a temperature elevated to a prescribed level is maintained inside the reaction container for a prescribed span of time, the surface of the crude metal is allowed to react with said halogen and then the product formed thereby is removed with suction. When the reaction container has a sufficiently high temperature, almost all halides of metallic impurities are easily carried away out of the container because of their high vapor pressure. The contaminated surface layer of the crude metal is gradually removed by implementing this procedure repeatedly.

The contaminated surface layer preferably more than 5 μm deep, more preferably more than 10 μm deep from the surface is removed by these methods.

Further, the content of impurities including Al can be relatively reduced by selecting and using Ti particles and the like of a comparatively small particle diameter which have smaller specific area. This helps in efficient removal of the contaminated surface layer. The substantially same effect can be achieved by sieving particles after the removal of their contaminated surface layer and selectively using those of comparatively larger particle diameter.

After the contaminated surface layer is so removed, the EB melting is employed in a high vacuum similar to the above mentioned first method in order to finally remove Al, Na, K and the like and obtain a highly purified metal. Ordinarily, when the EB melting is intended, it is thought that the Ti particles previously obtained should be compressed into a solid by a molding press and that the so obtained solid should be used as an electrode for the EB melting. In this case, however, recontamination on account of deformation incidental to molding is likely. Thus, for the purpose of preventing recontamination, it is preferable under the present invention that Ti particles are placed as they are into a vibrating granulator and subjected to the EB melting.

Furthermore, the above mentioned removal treatment of the contaminated surface layer of metals obtained by the fused salt electrolysis process can be efficiently applied in the case where Ti materials obtained by the fused salt electrolysis process are used as a starting material for the first manufacturing method. Briefly speaking, a Ti material obtained by the fused salt electrolysis process wherein the contaminated surface layer thereof was subjected to surface treatment is purified by the iodide process at first. Then, the so purified is EB melted. In this way, the iodide process is allowed to achieve even higher purification efficiency. Meanwhile, pretreat incidental to the iodide process can be done in one same apparatus, the above mentioned (2) is preferably used.

Metals obtained according to either the first or second method have a Al content of satisfying not more than 10 ppm, an reduced content of other impurities and a high purity to a satisfaction. With regards to other impurities, for example the oxygen content is not more than 250 ppm (preferably not more than 200 ppm), each of the Fe, Ni and Cr contents is not more than 10 ppm (preferably not more than 5 ppm each) and each of the Na and K contents is not more than 0.1 ppm (preferably not more than 0.05 ppm each).

Further, sputtering targets of the present invention are obtained by cold-forging the highly purified Ti material, the highly purified Zr material pr the highly purified Hf material into a desired shape, while preventing their recontamination. Said cold-forging is carried out in a cold condition (at about room temperature), taking into consideration the properties of, for example the Ti material with high gas absorption and the feasibility of preventing recontamination due to gas absorption. The processibility improved by satisfying a high purity makes cold-working possible. This is followed by machine-working of target materials to provide sputtering targets in a prescribed shape.

Next, the specific embodiments of manufacturing the highly purified metals of the present invention and the results of evaluating them will be described. Each embodiment of applying the first method for the manufacture of highly purified metal of the present invention will be shown below.

Embodiment 1

Sponge Ti was manufactured according to the Kroll process in order to use it as a starting crude Ti material. The so obtained sponge Ti was set in the reaction container 1 of the purification apparatus using the iodide process, as shown in FIG. 1 and the amount of an iodine representing a ratio of 0.2 g/l was also placed therein. Said sponge Ti was purified by the iodide process under the conditions that the temperature of the filament 5 was maintained at 1400° C. and that of the reaction container 1 at 600° C. The filament 5 had a diameter of 2 mm when the purification was started and Ti was allowed to precipitate thereon until the diameter was increased to about 30 mm.

The figment with precipitated Ti was used as a starting material for EB melting to conduct the EB melting under the conditions of a high vacuum of $1\times10^{-5}$ mbar in the furnace, preventing the entrance of diffusion pump oil into the furnace with the use of freon baffle, a voltage of 20 kV, a filament current of 1.5 A–2.0 A, a EB output of 30 KW–40 KW and a melting speed of 4 kg/hr. Thus, ingots having a diameter of 135 mm respectively obtained.

Further, said Ti ingots were forged in a cold condition (at about room temperature), followed by machine grinding thereof and the sputtering targets in a prescribed shape were obtained. The so obtained sputtering targets were analyzed for various impurities. The results are shown in Table 1.

Embodiment 2

The substantially same procedures for the iodide process and EB melting as in Embodiment 1 were repeated except that the crude Ti material of said Embodiment 1 was replaced by Ti in a shape of needle obtained by the fused salt electrolysis process and Ti ingots obtained therefrom were processed to produce Ti targets. The so obtained Ti targets were analyzed, resulting in the determinations also shown in Table 1.

Embodiment 3

First, needle shaped-Ti of the fused salt electrolysis process which had been used as the crude Ti material in above Embodiment 2 was immersed in a mixture of hydrofluoric acid, nitric acid and water in a ratio of 2:1:1 for 10 minutes in order to remove the contaminated surface layer. The so treated needle shaped-Ti was washed with running water to make a starting Ti material. Meanwhile, the contaminated surface layer 15 μm deep from the surface was removed.

The iodide process and the EB melting were implemented according to the same procedure as in Embodiment 1, except that above acid treated Ti material was used and the Ti ingots obtained therefrom were further processed to make Ti targets. The so obtained Ti targets were analyzed, resulting in the determinations shown in Table 1 as well.

Embodiment 4

In the reaction container 1 of the purification apparatus using the iodide process as shown FIG. 1, the needle shaped Ti which had been used as the crude Ti material in Embodiment 2 was placed, a gaseous iodine was introduced therein after vacuum exhaust, the temperature was maintained at 600° C. and the surface of the needle shaped Ti was allowed to react with the iodine. Then, the reaction product was eliminated by vacuum exhaust.

This procedure was repeated 3 times to remove the contaminated surface layer. The contaminated surface layer 15 μm deep from the surface was removed. Meanwhile, the used purification apparatus had an exhaust system connected with the reaction container via an iodide trapping mechanism which is missing in the illustration.

Subsequent to the removal of the contaminated surface layer, the filament 5 was electrically charged, the iodide process and the EB melting were carried out and Ti ingots were obtained. Then, Ti targets were made thereof. The so obtained targets were analyzed, resulting in the determinations shown in FIG. 1 as well.

The crude Ti materials used in Embodiments 1 and 2 were also analyzed, the results shown in Table 1 respectively as the Comparative Embodiments 1 and 2.

TABLE 1

| | Impurities (ppm) | | | | | | | | |
|---|---|---|---|---|---|---|---|---|---|
| | Al | Fe | Ni | Cr | Na | K | U | Th | O |
| Emb. 1 | 3 | 2.5 | 1.5 | 1.5 | <0.1 | <0.1 | <0.001 | <0.001 | 100 |
| Com. Emb. 1 | 25 | 65 | 23 | 15 | 0.6 | 10.3 | <0.001 | <0.001 | 450 |
| Emb. 2 | 2 | 1.0 | 0.5 | 1.0 | <0.1 | <0.1 | <0.001 | <0.001 | 80 |
| Com Emb. 2 | 15 | 5 | 15 | 10 | 150 | 210 | <0.001 | <0.001 | 120 |
| Emb. 3 | <1 | 0.2 | 0.2 | 0/5 | <0.1 | <0.1 | <0.001 | <0.001 | 180 |
| Emb. 4 | <1 | 0.1 | 0.1 | 0.4 | <0.1 | 0.1 | <0.001 | <0.001 | 40 |

As evident from Table 1, the Ti materials of all the above mentioned embodiments have a low content of Al that should adversely affect the properties of electrode, contact part, barrier layers and the like in a semi-conductor device, keeping the content of other impurities at a reduced level and satisfying the purity as it should be.

The properties were evaluated on each of the semiconductor device which was produced by forming the wiring network of metal silicide film on the substrate with use of each of the Ti target obtained in connection with the embodiment and the comparative embodiment and the Zr target and the Hf target produced according to substantially the same procedure. The production method, the evaluating method and the results thereof will now be described in detail.

Figure 2:
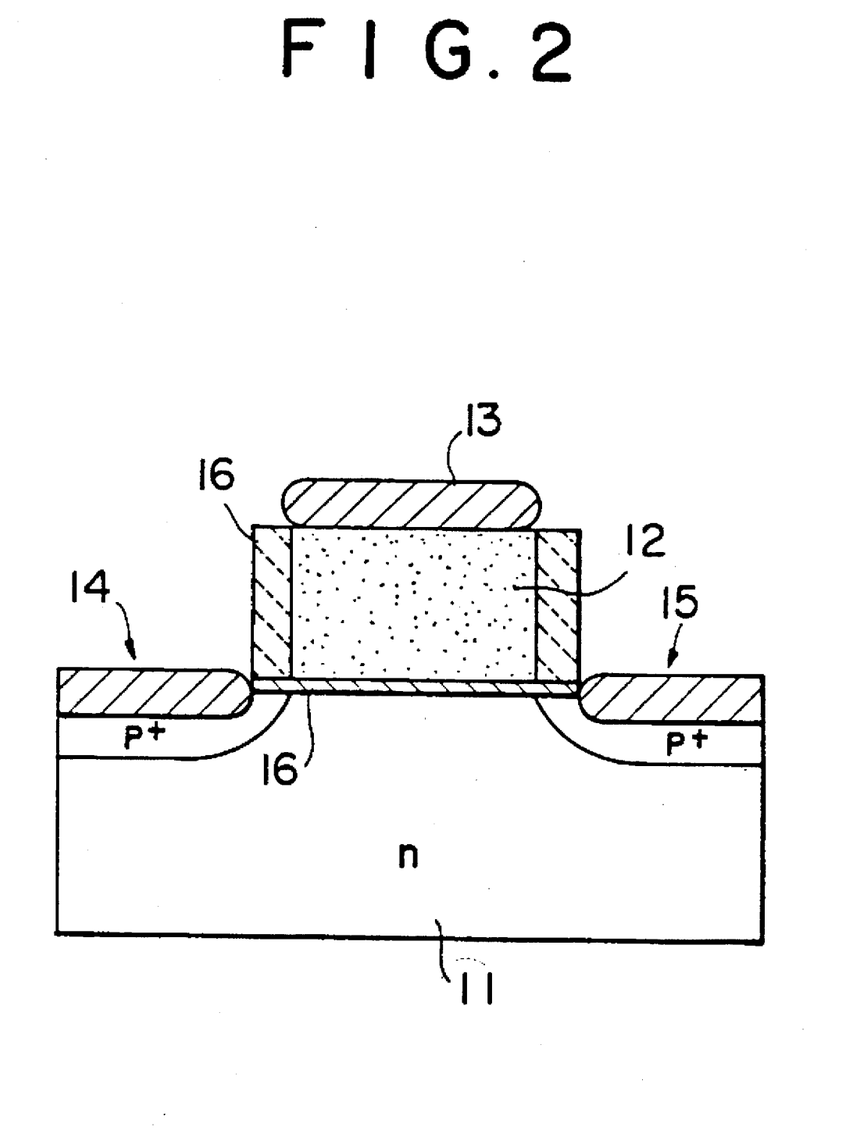
FIG. 2 is to describe the structure of a diode prepared in one embodiment of the present invention.

The influence each by Al contained in various metal target were evaluated and the results thereof will be described at first. As shown in FIG. 2, over the polycrystalline Si layer 12 above the n-Si substrate 11, a Ti film, a Zr film and a Hf film, each 60 nm thick, were respectively formed by the sputtering method using each of 3 types of Ti target, Zr target and Hf target which were produced according to substantially the same procedure as in the corresponding embodiment and each type of which has different Al content. After each film was treated by etching to remove portions other than the desired wiring network, the remaining film was subjected to 2 step annealing treatment to comprise a silicide and form a metal silicide film ($TiSi_2$ film, $ZrSi_2$ film, $HfSi_2$) over the polycrystal Si layer 12 and at the same time both the source region 14 and the drain region 15 were made to comprise a silicide and the diode of each metal silicide film was produced.

Each type of Ti target contained Al in an amount of not more than 54 ppm, 3 ppm and 1 ppm; that of Zr target not more than 68 ppm, 3 ppm and 1 ppm; and that of Hf target not more than 70 ppm, 2 ppm and 1 ppm. Other impurities contained in these targets were in an equal amount. The leakage current was measured by applying an inverse bias voltage to the so obtained diodes to obtain the results respectively in FIG. 3, FIG. 4 and FIG. 5.

Figure 3:
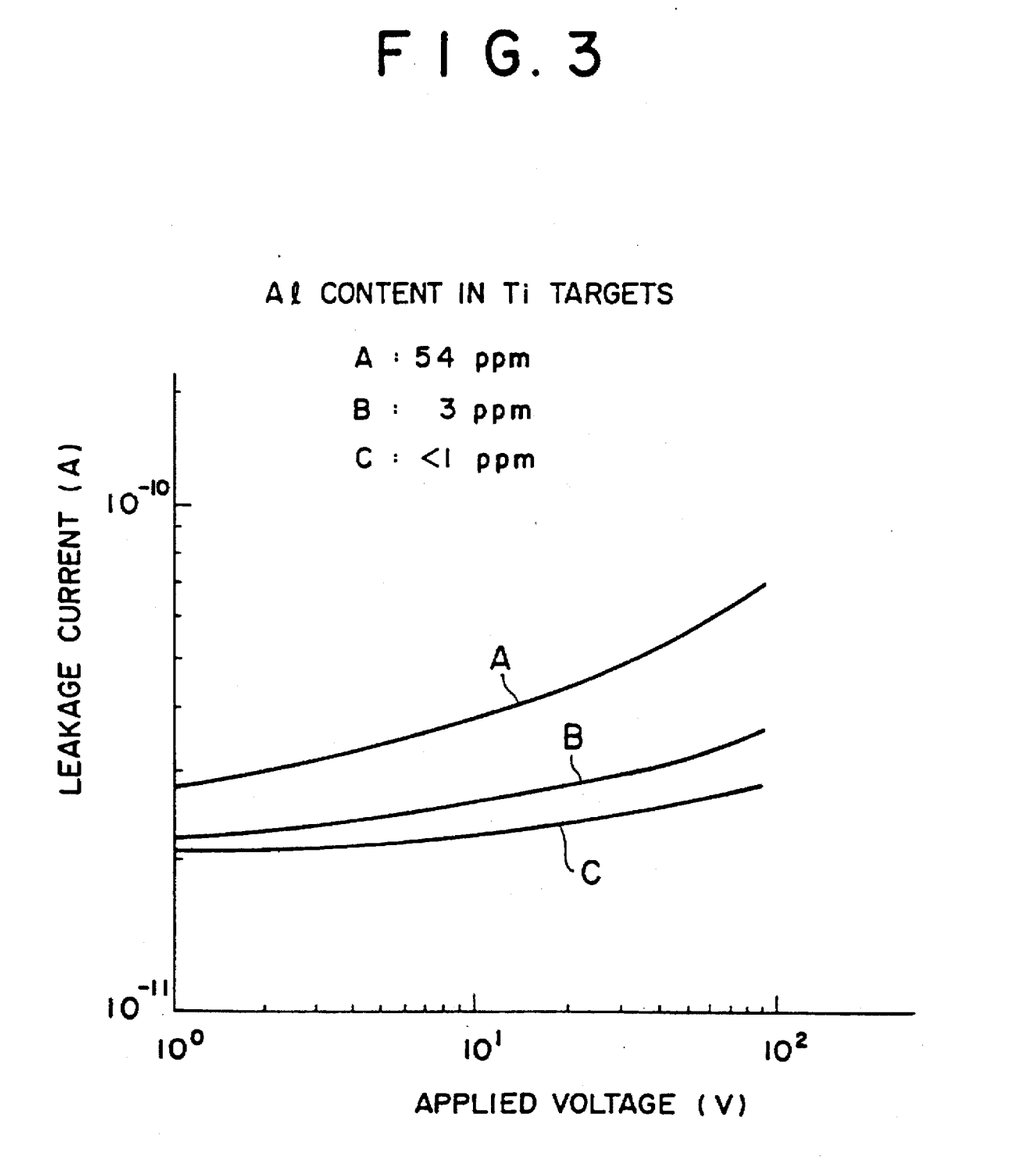
FIG. 3 shows the relationship of the Al content of a Ti target prepared in one embodiment of the present invention with the leakage current of a diode having a $TiSi_2$ film formed of said Ti target.
Figure 4:
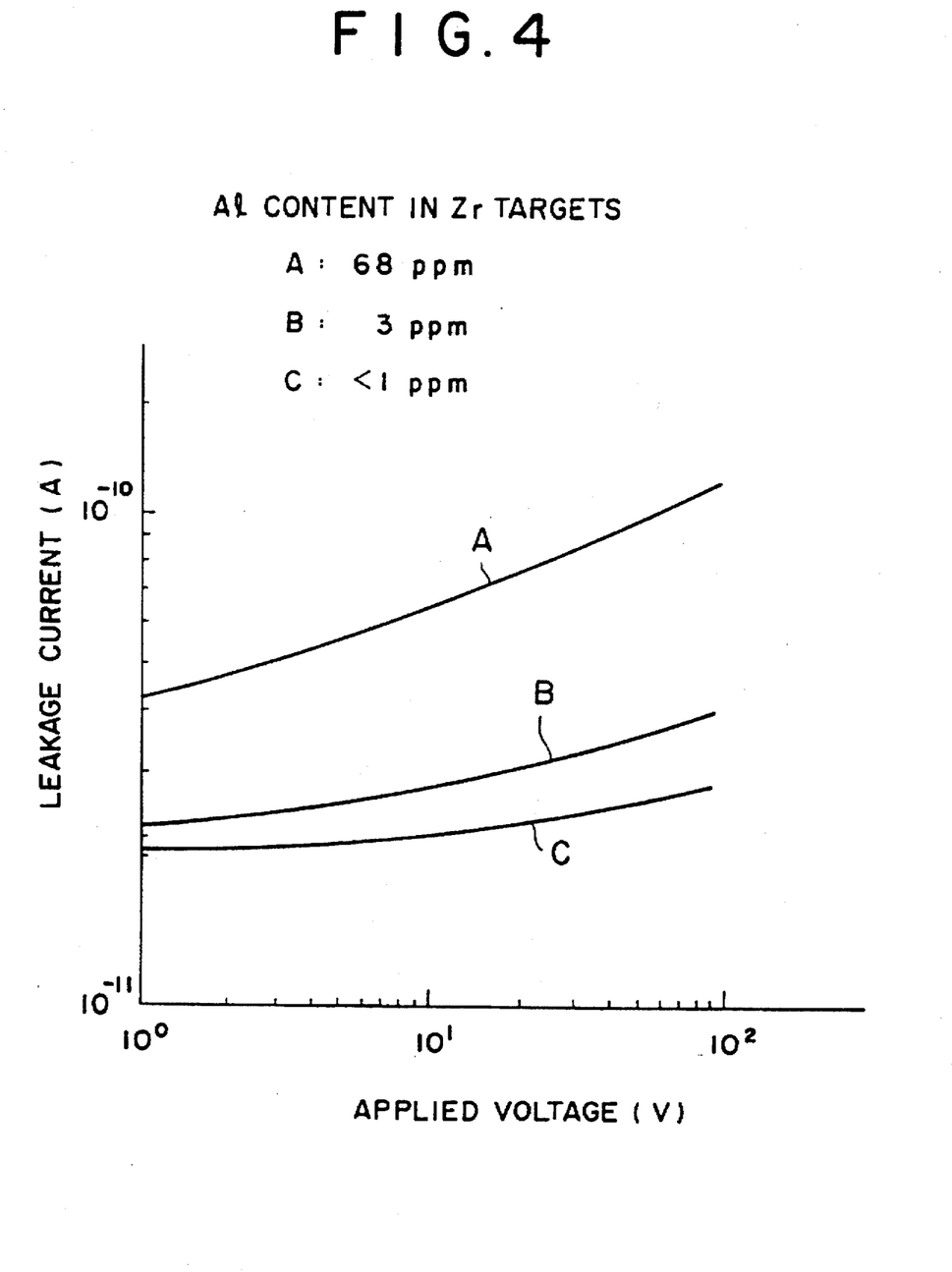
FIG. 4 shows the relationship of the Al content of a Zr target prepared in one embodiment of the present invention with the leakage current of a diode having a $ZrSi_2$ film formed of said Zr target.
Figure 5:
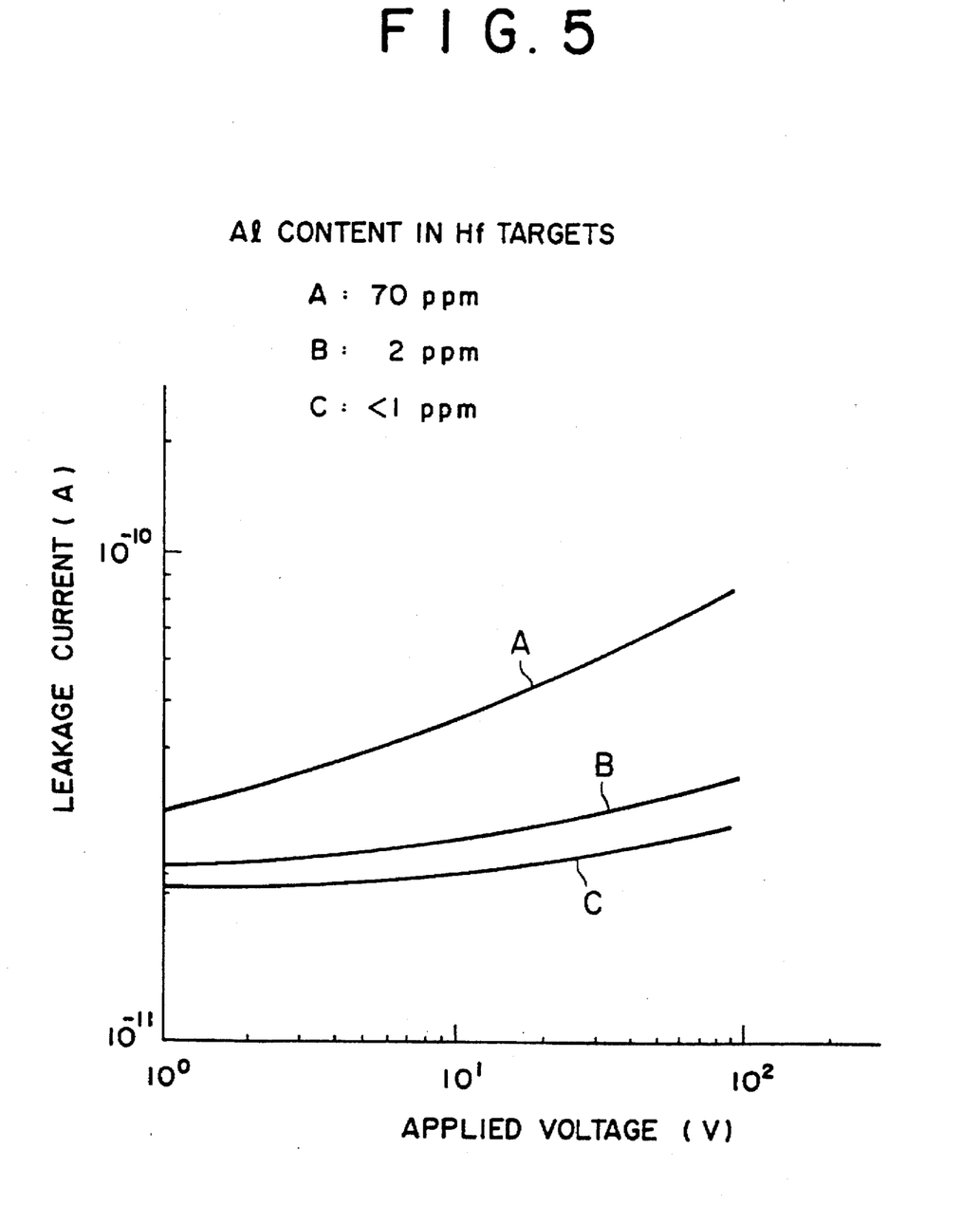
FIG. 5 shows the relationship of the Al content of a Hf target prepared in one embodiment of the present invention with the leakage current of a diode having a $HfSi_2$ film formed of said Hf target.

As evident from FIG. 3, FIG. 4 and FIG. 5, the leakage current increased as the Al content increased. Meanwhile, 10 diodes were made of all metal targets and when they were subjected to a measurement according to the substantially same procedure, there was a finding that each of these diodes shows a same inclination.

In other words, an electrode, a contact part and the like having a high fidelity for a highly integrated semi-conductor device can be accomplished by making a sputtering target of a metal having a low Al content as obtained in the above mentioned embodiments, producing a metal target of said sputtering target and forming a desired form therefrom.

Next, the relationship between the oxygen content of a Ti target and specific resistance of a $TiSi_2$ made thereof will be described below. 6 types of Ti target each having a different oxygen content (oxygen content: 80 ppm, 120 ppm, 200 ppm, 300 ppm, 550 ppm and 700 ppm) were made according to the substantially same procedure as in the above mentioned embodiments. The film forming apparatus was evacuated to $1 \times 10^{-5}$ Torr, then an Ar gas was introduced thereto up to $5 \times 10^{-3}$ and over a polycrystalline Si a Ti film, 0.2 μm thick, was formed of each type of said Ti target by DC magnetron sputtering at film forming speed of 2.0 μm/h. After specific resistance of these films were measured, they were subjected to annealing at 700° C., Ti and Si were allowed to react each other and a $TiSi_2$ was complete. These $TiSi_2$ films were measured for their specific resistance. The resistance of the film times the thickness of the film makes specific resistance. The resistance of the film was measured according to the direct-current 4 points probe method (the production of NAPUSON Kabushiki Kaisha, RESISTEST-8A).

The relationship between the oxygen content of Ti targets and specific resistance of $TiSi_2$ films is shown in Table 2. The relationship between specific resistance of Ti films and that of $TiSi_2$ films is shown in FIG. 6.

TABLE 2

| Oxygen content (ppm) | 700 | 550 | 300 | 120 | 80 |
|---|---|---|---|---|---|
| Specific resistance Ti film (μΩ.cm) | 123 | 115 | 105 | 70 | 65 |

Figure 6:
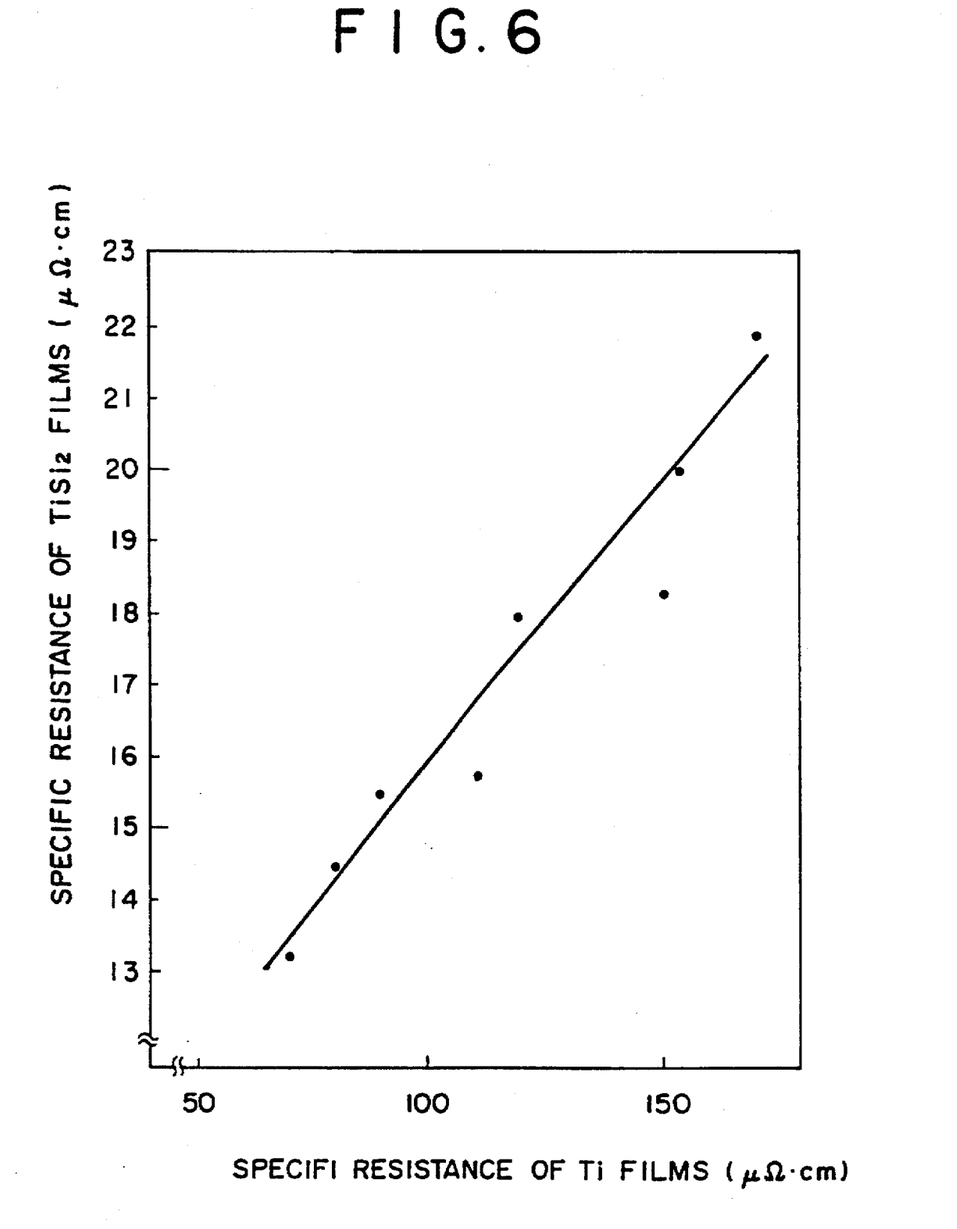
FIG. 6 shows the relationship of Ti film prepared in one embodiment of the present invention with specific resistance of a $TiSi_2$ film formed of said Ti film.

It is evident from Table 2 and FIG. 6 that specific resistance of Ti films can be reduced by decreasing the oxygen content of Ti targets. Further, specific resistance of $TiSi_2$ films can also be lowered by lowering specific resistance of Ti films. Particularly, $TiSi_2$ having as low specific resistance as 15 μΩ.cm are not obtained by using Ti targets having an oxygen content of more than 250 ppm. A $TiSi_2$ film having low resistance means the prevention of delay of signals in a semi-conductor device to make possible a semi-conductor device having high fidelity.

Next, an embodiment wherein the second method for the manufacture of highly purified metal was carried out will be described.

Embodiment 5

An electrode made of sponge Ti was placed in an electrolyte comprising KCl—NaCl (KCl:16% by weight, NaCl:84% by weight) and subjected to fused salt electrolysis process at an electrolytic temperature of 755° C., a current of 200 A and a voltage of 80V in order to produce a crude needle-shaped Ti particle. The contaminated surface layer of these crude needle-shaped Ti materials was removed by means of an aqueous solution of hydrochloric acid. Said acid treatment was conducted by immersing the crude Ti materials in said aqueous solution of hydrochloric acid in an argon gas atmosphere for each different from span of time and then they were washed with purified water and dried. In this way, several types of Ti materials in which the amount of the surface layer removed by acid treatment is different each other were prepared. Prior to the acid treatment, said crude needle shaped Ti materials were analyzed to determine the relationship of the Al content with the thickness of the removed layer or the distance ban the surface of particles and the bottom of the removed layer. The results are shown in Table 7. As evident from FIG. 7, the content of impurities can be significant decreased by removing the surface layer about 10 μm deep from the particle surface.

Next, the crude Ti particles immersed in the acid for different spans of time were used as a starting material for EB melting and placed in a vibrating granulator. Said granulator was introduced into an EB melting furnace in a vacuum, while preventing the contamination. EB melting was conducted under the conditions of a high vacuum of $1 \times 10^{-5}$ mbar in the furnace, preventing the entrance of diffusion pump oil into the furnace with a freon baffle, voltage of 20 KV, a filament current of 1.3 A–1.5 A, an EB output of 26 KW–30 KW and a melting speed of 4 kg/h in order to make ingots having a diameter of 135 mm.

Each of the so obtained Ti materials was analyzed for impurities. The relationship between the Al content and the amount of the removal by acid treatment is shown in Table 3. With regards to other impurities, each of the Fe, Ni and Cr contents was not more than 1 ppm, each of the Na and K contents was not more than 0.01 ppm and the oxygen content was not more than 200 ppm.

TABLE 3

| Changes in Weight Due to Acid Treatment (%) | Al Content Before and After Acid Treatment (ppm) | | Al Content after EB Melting (ppm) |
|---|---|---|---|
| | before | after | |
| No acid treatment | 18 | 18 | 12.2 |
| 0.5 | " | 17.5 | 9.5 |
| 2 | " | 8.2 | 2.3 |
| 4 | " | 1.5 | 0.8 |
| 5 | " | 1.2 | 0.7 |
| 8 | " | 1.0 | 0.5 |
| 10 | " | 0.82 | 0.3 |
| 30 | " | 0.3 | 0.3 |

As evident from Table 3, the embodiment showed that the Ti material having a satisfactorily high purity, a low content of Al adversely affecting the properties of electrode, contact part and barrier layer of semi-conductor devices and a reduced content of other purities was obtained by removing the surface layer from the crude Ti material and then Eb melting it.

Further, when the Zr and Hf materials were highly purified according to the substantially same procedure as in above mentioned Embodiment 5, the substantially same results were achieved.

Next, the present invention will be described by the following embodiment in connection with a semi-conductor package using the wiring network of the present invention.

Figure 7:
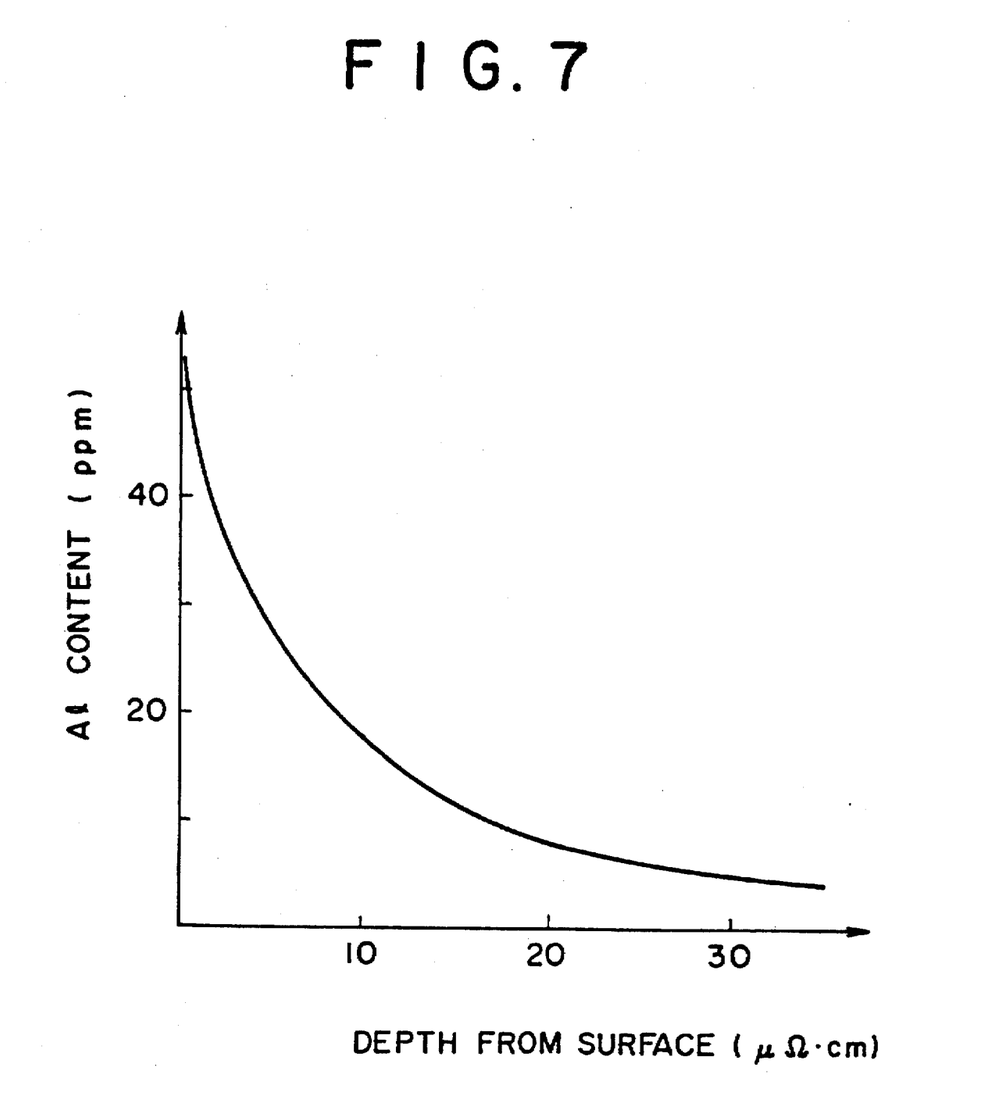
FIG. 7 relates to the fused salt electrolysis process used in one embodiment of the present invention, showing the relationship of the distance between the surface of the electrolyte and the location of a Ti material made therefrom with the Al content of said Ti material.
Figure 8:
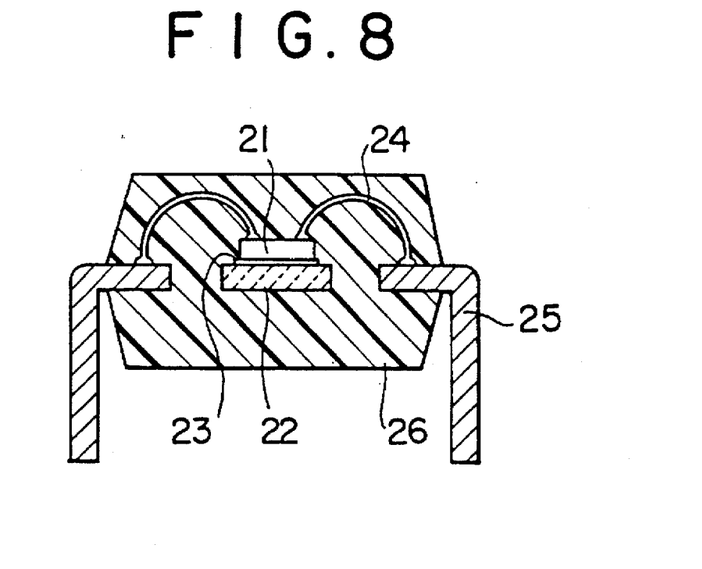
FIG. 8 is a cross-section outlining the structure of a semi-conductor package obtained in connection with one embodiment of the present invention.

FIG. 7 is a drawing outlining the structure of one instance of the semi-conductor package. Here, 21 is a semi-conductor chip set on an insulation substrate 22 by a solder layer 23. The semi-conductor chip 21 is electrically connected with a lead frame 25 by a Au lead wire 25. The semi-conductor chip 21, Au lead wire 24 and lead frame 25 are sealed together in a molding by a sealing resin 26.

The semi-conductor chip 21 comprises the highly purified metal of the present invention and is used as the material for a part of the wiring network. The semi-conductor chip 21 and the method for producing the same will be described referring to FIG. 9.

Figure 9:
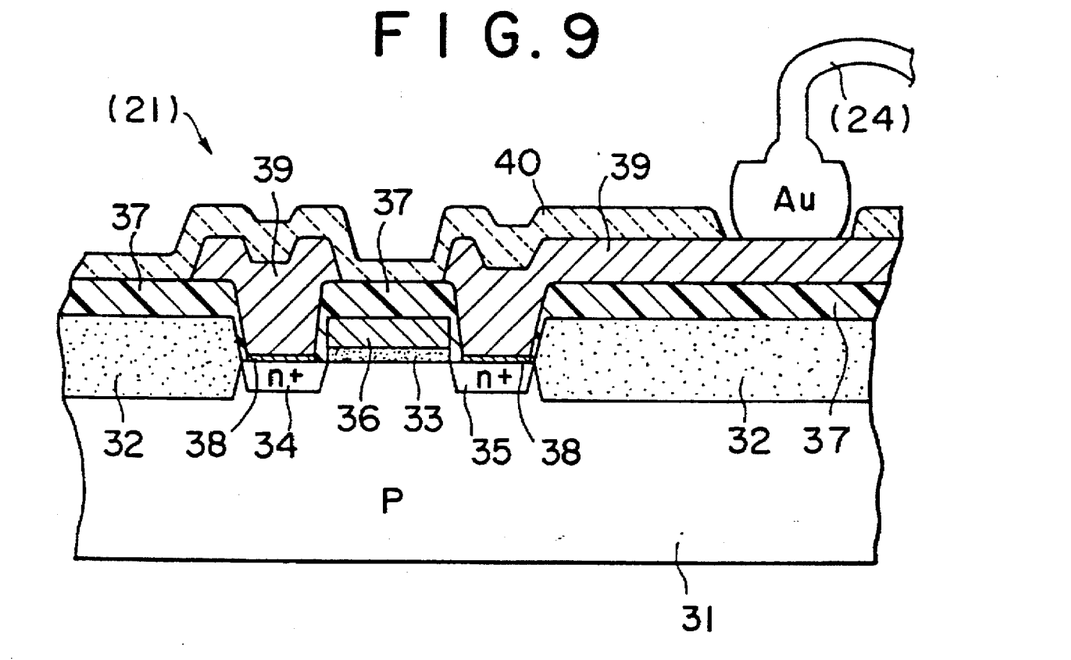
FIG. 9 is a cross-section outlining the structure of a semi-conductor chip used in the semi-conductor package shown in FIG. 8.

First, a p-Si substrate 31 is treated by thermal oxidation to form a thermally oxidized film on the surface of p-Si substrate. Then, a field oxidized film 32 is optionally formed by thermal oxidation except for the source and drain regions. Portions of the thermally oxidized film on each of the source and drain regions were eliminated by formation of a resist film and etching treatment (hereinafter called PEP treatment for short) to give a thermally oxidized film 33 remaining on the gate region. Then, after the resist film is formed except for the source and drain regions, elements as the impurity are injected into the p-Si substrate 31 to produce the source region 34 and the drain region 35. Further, a Mo or W silicide film 36 is formed on the gate oxidized film 33. An insulation layer 37 comprising P-doped silica glass (PSG) is formed all over the p-Si substrate and then both the source region 34 and the drain region 35 were subjected to PEP treatment to remove portions of the P-doped silica glass layer 37 located thereon.

Then, a barrier layer 38 is formed respectively on the source region 34 and the drain region 35 after portions of the P-doped silica glass layer 37 are removed therefrom. These barrier layers 38 are the film comprising the highly purified metal of the present invention. Namely, substantially the same materials as Ti target, Zr target and Hf target used in the above mentioned embodiment are treated by the reactive sputtering method in an nitrogen gas atmosphere to produce a TiN film, a ZrN film, a HfN film each of which contains Al in a very small amount and is used to form the barrier layer 38.

Thereafter, an Al film 39 is formed by vacuum evaporation to cover the whole surface and obtain the wiring network in a desired shape. Further, an insulating protection film 40 comprising Si3N4 and the like is formed all over, a portion thereof is subjected to PEP treatment to build an opening for bonding of the Au lead wire (24) and finally an semi-conductor chip (21) is complete.

The barrier layer which is sound even when the wiring network is densely formed can be obtained by producing the TiN film, ZrN film and Hf film from the highly purified metal of the present invention. This is because content of impurities inside the barrier layer 38 can be controlled to be very small, including that of Al, oxygen, alkali and heavy metals, and as a result the semi-conductor package having the high operational reliability can be obtained.

The description of the above mentioned embodiment relates only to the case where the highly purified metal of the present invention is used as the material for barrier layers but also is true in the case of using it as the material for electrodes and contact parts. Further, although an instance of DIP is described in the above mentioned embodiment, substantially the same effect can be obtained with respect to packages of QFP, PGA and the like.

What is claim is:

1. A semi-conductor package comprising:
a semi-conductor chip having a prescribed wiring circuit wherein at least a part of the wiring network comprises one metal selected from the group consisted of titanium, zirconium and hafnium or a compound thereof each containing not more than 10 ppm of Al, and a lead electrically connected with said circuit of the semi-conductor chip and a sealing material for making said semi-conductor chip airtight.

2. The semi-conductor package according to claim 1, wherein said wiring network comprises an electrode, a contact part, a barrier layer and the like.

3. The semi-conductor package according to claim 1, wherein said wiring network contains not more than 250 ppm of oxygen; not more than 10 ppm each of elements consisting of Fe, Ni and Cr, and not more than 0.1 ppm each of elements consisting of Na and K.

* * * * *